(12) United States Patent
Robl et al.

(10) Patent No.: US 6,720,212 B2
(45) Date of Patent: Apr. 13, 2004

(54) METHOD OF ELIMINATING BACK-END REROUTING IN BALL GRID ARRAY PACKAGING

(75) Inventors: Werner Robl, Poughkeepsie, NY (US); Thomas Goebel, Fishkill, NY (US); Axel Christoph Brintzinger, Dresden (DE); Gerald Friese, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/098,840

(22) Filed: Mar. 14, 2002

(65) Prior Publication Data

US 2003/0183913 A1 Oct. 2, 2003

(51) Int. Cl.$^7$ ............................................... H01L 21/82
(52) U.S. Cl. ........................ 438/132; 438/128; 438/130; 438/281; 438/612; 257/675; 257/758; 257/768
(58) Field of Search .................... 257/675, 758, 257/768; 438/128, 132, 281, 612

(56) References Cited

U.S. PATENT DOCUMENTS

| | | | | | |
|---|---|---|---|---|---|
| 5,969,424 | A | * | 10/1999 | Matsuki et al. | 257/768 |
| 6,033,939 | A | * | 3/2000 | Agarwala et al. | 438/132 |
| 6,037,044 | A | * | 3/2000 | Giri et al. | 428/209 |
| 6,300,234 | B1 | * | 10/2001 | Flynn et al. | 438/612 |
| 2002/0056910 | A1 | * | 5/2002 | Howell et al. | 257/737 |

* cited by examiner

Primary Examiner—David Nelms
Assistant Examiner—Dao H. Nguyen

(57) ABSTRACT

Disclosed is a method of ball grid array packaging, comprising the steps of providing a semiconductor die having a metal conductors thereon, covering said metal conductors with an insulative layer, etching through said insulative layer so as to provide one or more openings to said metal conductors, depositing a compliant material layer, etching through said compliant material layer so as to provide one or more openings to said metal conductors, depositing a substantially homogenous conductive layer, patterning said conductive layer so as to bring at least one of said metal conductors in electrical contact with one or more pads, each said pad comprising a portion of said conductive layer disposed upon said compliant material, and providing solder balls disposed upon said pads. Also disclosed is the apparatus made from the method.

11 Claims, 2 Drawing Sheets

METHOD OF ELIMINATING BACK-END REROUTING IN BALL GRID ARRAY PACKAGING

FIELD OF THE INVENTION

This invention relates to improvements in micro-BGA chip scale packaging.

BACKGROUND OF THE INVENTION

Chip scale packaging (CSP) of integrated circuits is a widely accepted electronic systems packaging technology. Ball grid array (BGA) packaging, such as the μBGA® package developed by Tessera Technologies of San Jose, Calif., is often looked to as the chip scale packaging (CSP) method of choice, it being valued for accommodating the mismatch in coefficients of thermal expansion (CTE) between silicon and commonly used substrates, such as FR-4 epoxy circuit boards.

The fundamentals of micro-BGA technology are generally summarized in the six patents set forth below, the disclosures of which are incorporated by reference herein in their entirety Khandros et al., U.S. Pat. No. 5,148,265, for SEMICONDUCTOR CHIP ASSEMBLIES WITH FAN-IN LEADS, discloses a semiconductor chip having contacts on the periphery of its top surface is provided with an interposer overlying the central portion of the top surface. Peripheral contact leads extend inwardly from the peripheral contacts to central terminals on the interposer. The terminals on the interposer may be connected to a substrate using techniques commonly employed in surface mounting of electrical devices, such as solder bonding. The leads, and preferably the interposer, are flexible so that the terminals are movable with respect to the contacts on the chip, to compensate for differential thermal expansion of the chip and substrate. The terminals on the interposer may be disposed in an area array having terminals disposed at substantially equal spacings throughout the area of the interposer, thus providing substantial distances between the terminals while accommodating all of the terminals in an area approximately the same size as the area of the chip itself. The interposer may be provided with a compliant layer disposed between the terminals and the chip to permit slight vertical movement of the terminals towards the chip during testing operations. The chip and interposer assembly may be electrically tested prior to assembly to the substrate. A compliant layer disposed between the terminals and the chip permits slight vertical movement of the terminals towards the chip during testing operations, in which the terminals on the interposer are engaged with an assembly of test probes. The entire assembly is compact.

Khandros et al., U.S. Pat. No. 5,148,266, for SEMICONDUCTOR CHIP ASSEMBLIES HAVING INTERPOSER AND FLEXIBLE LEAD, discloses a semiconductor chip assembly is mounted to contact pads in a compact area array. An interposer is disposed between the chip and the substrate. The contacts on the chip are connected to terminals on the interposer by flexible leads extending through apertures in the interposer. The terminals on the interposer in turn are bonded to the contact pads on the substrate. Flexibility of the leads permits relative movement of the contacts on the chip relative to the terminals and the contact pads of the substrate and hence relieves the stresses caused by differential thermal expansion. The arrangement provides a compact structure similar to that achieved through flip-chip bonding, but with markedly increased resistance to thermal cycling damage.

DiStefano et al., U.S. Pat. No. 5,455,390, for a MICROELECTRONICS UNIT MOUNTING WITH MULTIPLE LEAD BONDING, discloses a component for mounting semiconductor chips or other microelectronic units includes a flexible top sheet with an array of terminals on it, and with flexible leads extending downwardly from the terminals. A compliant dielectric support layer surrounds the leads, holding the lead tips in precise locations. The leads are desirably formed from wire such as gold wire, and have eutectic bonding alloy on their tips. The component can be laminated to a chip or other unit under heat and pressure to form a complete subassembly with no need for individual bonding to the contacts of the chip. The subassembly can be tested readily and provides compensation for thermal expansion.

Distefano et al., U.S. Pat. No. 5,518,964, for a MICROELECTRONIC MOUNTING WITH MULTIPLE LEAD DEFORMATION AND BONDING, discloses a microelectronic connection component includes a dielectric sheet having an area array of elongated, strip-like leads. Each lead has a terminal end fastened to the sheet and a tip end detachable from the sheet. Each lead extends horizontally parallel to the sheet, from its terminal end to its tip end. The tip ends are attached to a second element, such as another dielectric sheet or a semiconductor wafer. The first and second elements are then moved relative to one another to advance the tip end of each lead vertically away from the dielectric sheet and deform the leads into a bent, vertically extensive configuration. The preferred structures provide semiconductor chip assemblies with a planar area array of contacts on the chip, an array of terminals on the sheet positioned so that each terminal is substantially over the corresponding contact, and an array of metal S-shaped ribbons connected between the terminals and contacts. A compliant dielectric material may be provided between the sheet and chip, substantially surrounding the S-shaped ribbons.

Khandros et al., U.S. Pat. No. 5,679,997, for a SEMICONDUCTOR CHIP ASSEMBLIES, METHODS OF MAKING SAME AND COMPONENTS FOR SAME, discloses semiconductor chip assemblies incorporating flexible, sheet-like elements having terminals thereon overlying the front or rear face of the chip to provide a compact unit. The terminals on the sheet-like element are movable with respect to the chip, so as to compensate for thermal expansion. A resilient element such as a compliant layer interposed between the chip and terminals permits independent movement of the individual terminals toward the chip driving engagement with a test probe assembly so as to permit reliable engagement despite tolerances.

Khandros et al., U.S. Pat. No. 5,685,855, for a WAFER-SCALE TECHNIQUES FOR FABRICATION OF SEMICONDUCTOR CHIP ASSEMBLIES, discloses a method wherein semiconductor chip assemblies are fabricated by assembling flexible, sheetlike elements bearing terminals to a wafer, connecting the terminals of each sheetlike element to contacts on the chip, and subsequently severing the chips from the wafer to provide individual assemblies. Each assembly includes a sheetlike element and a chip, arranged so that the terminals on the flexible element are movable with respect to the chip.

SUMMARY OF THE INVENTION

Disclosed is a method of ball grid array packaging, comprising the steps of providing a semiconductor die having a metal conductors thereon, covering said metal conductors with an insulative layer, etching through said insulative layer so as to provide one or more openings to said metal conductors, depositing a compliant material layer, etching through said compliant material layer so as to provide one or more openings to said metal conductors, depositing a substantially homogenous conductive layer, patterning said conductive layer so as to bring at least one of said metal conductors in electrical contact with one or more pads, each said pad comprising a portion of said conductive layer disposed upon said compliant material, and providing solder balls disposed upon said pads.

Another aspect of the method further comprises the step of depositing a passivation layer prior to said deposition of said compliant material layer.

In another aspect of the method said passivation layer comprises a silicon nitride layer atop a silicon oxide layer.

In another aspect of the method said passiviation layer comprises borosilicate glass.

In another aspect of the method said metal conductors are a metallic damascene layer.

In another aspect of the method said metal conductors comprise copper.

In another aspect of the method said insulative layer comprises a silicon oxide layer atop a silicon nitride layer.

In another aspect of the method said step of etching through said compliant material is executed in a manner effective in not etching said insulative layer and in forming vias of greater width than said openings through said insulative layer.

In another aspect of the method said conductive layer comprises aluminum and copper.

Another aspect of the method further comprising the step of depositing a barrier layer prior to said deposition of said conductive layer.

In another aspect of the method said barrier layer comprises at least one of tantalum nitride, titanium nitride, or tungsten nitride.

In another aspect of the method said compliant material comprises a poly-imide.

Disclosed is a ball grid array package, comprising a semiconductor die having a compliant layer thereon and metallic circuitry therein, a substantially homogenous conductive layer deposited upon said compliant material and patterned so as to bring at least one point of said metallic circuitry into electrical contact with one or more pads, each said pad comprising a portion of said conductive layer disposed upon said compliant material, and one or more solder balls disposed upon said pads.

In another aspect of the invention said metal circuitry is a metallic damascene layer.

In another aspect of the invention said metal circuitry comprises copper.

In another aspect of the invention said conductive layer is deposited in-vias, said vias insulated from said metal circuitry by an insulative layer, said insulative layer having an openings therethrough to permit electrical contact between said metal circuitry and said conductive layer.

In another aspect of the invention said conductive layer comprises aluminum and copper.

Another aspect of the invention further comprises a barrier layer interposed between said conductive layer and said semiconductor die.

In another aspect of the invention said barrier layer comprises at least one of tantalum nitride, titanium nitride, or tungsten nitride.

In another aspect of the invention said compliant material comprises a poly-imide.

DETAILED DESCRIPTION OF PREFERRED EMBODIMENTS

Traditional chip packaging comprises a chip having "legs" about its outer periphery that plug into a socket. By using a grid array of contacts on the bottom surface of a chip, the number of available leads is the square of the available leads on the periphery. These are often also referred to as "area array" packaging and comprises a grid array of pins on the bottom surface of the chip, so called "pin grid arrays" (PGA). By the late 1980's, the pins had been replaced with small solder balls, hence the BGA. This technology is now extended to chip scale packaging (CSP), wherein the package is built to the scale of the chip itself. This implies the solder balls are directly or nearly directly attached to the chip, which has a vastly different coefficient of temperature expansion than the circuit board to which it will be attached, hence the possibility of breaking or shorting connections due to expansion and contraction is increasing.

Figure 1:
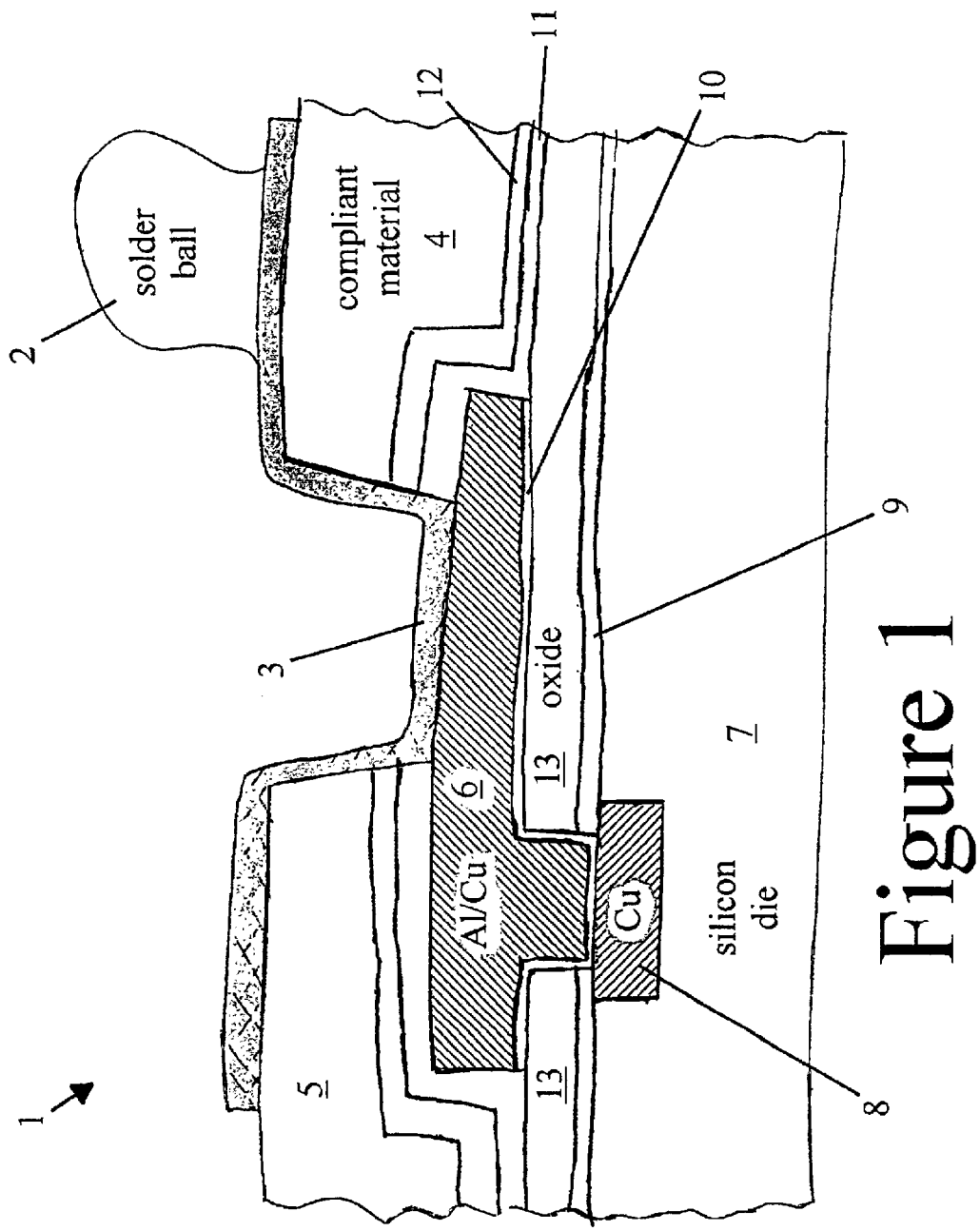
FIG. 1 shows the prior art of BGA packaging in cross section.

Referring to FIG. 1, these problems are solved with micro-BGA technology by interposing a compliant material between the silicon die and the solder spheres. In this drawing, you see a cross section of the chip, the solder balls 2 on top of the re-routing 3.

Referring to FIG. 1, the chip 1 is silicon based, having a Cu (dual-) damascene metallization 8 to connect the devices (for simplification reasons only the last Cu metal level is shown, no devices are shown). The Cu metallization is encapsulated by a silicon nitride layer 9. An oxide layer 13 is sued to insulate the aluminum pad 6 from the circuitry. Contact holes (vias) are etched into the oxide 13 and the silicon nitride 9. An aluminum-copper alloy layer is deposited on top of the oxide 13. Prior to the aluminum-copper alloy a barrier layer 10 is deposited. This barrier layer 10 can either be TaN, TiN, WN or any other metal or metal-nitride or electrically conductive material. After barrier and aluminum-copper alloy deposition the metal layers are patterned by a lithography and etch step, forming the bond pads. A passivation layer consisting of silicon oxide 11 and silicon nitride 12 is deposited afterwards.

The aluminum/copper bond pad 6 is brought into electrical contact with a solder ball 2 by a backend rerouting procedure wherein oxide layer 13 and nitride layer 12 have been etched through and a rerouting conductor 3, usually made of a copper/gold alloy, has been deposited. The solder balls 2 are then deposited upon the rerouting conductors 3. This allows the solder balls 2 to be in electrical contact with the circuitry of the chip. The compliant material allows the silicon die to expand and contract with temperature without affecting the spacing of the solder balls 2 and usually comprises a relatively thick polymer, such as a photo-sensitive poly-imide, which is used for patterning the pads.

Figure 2:
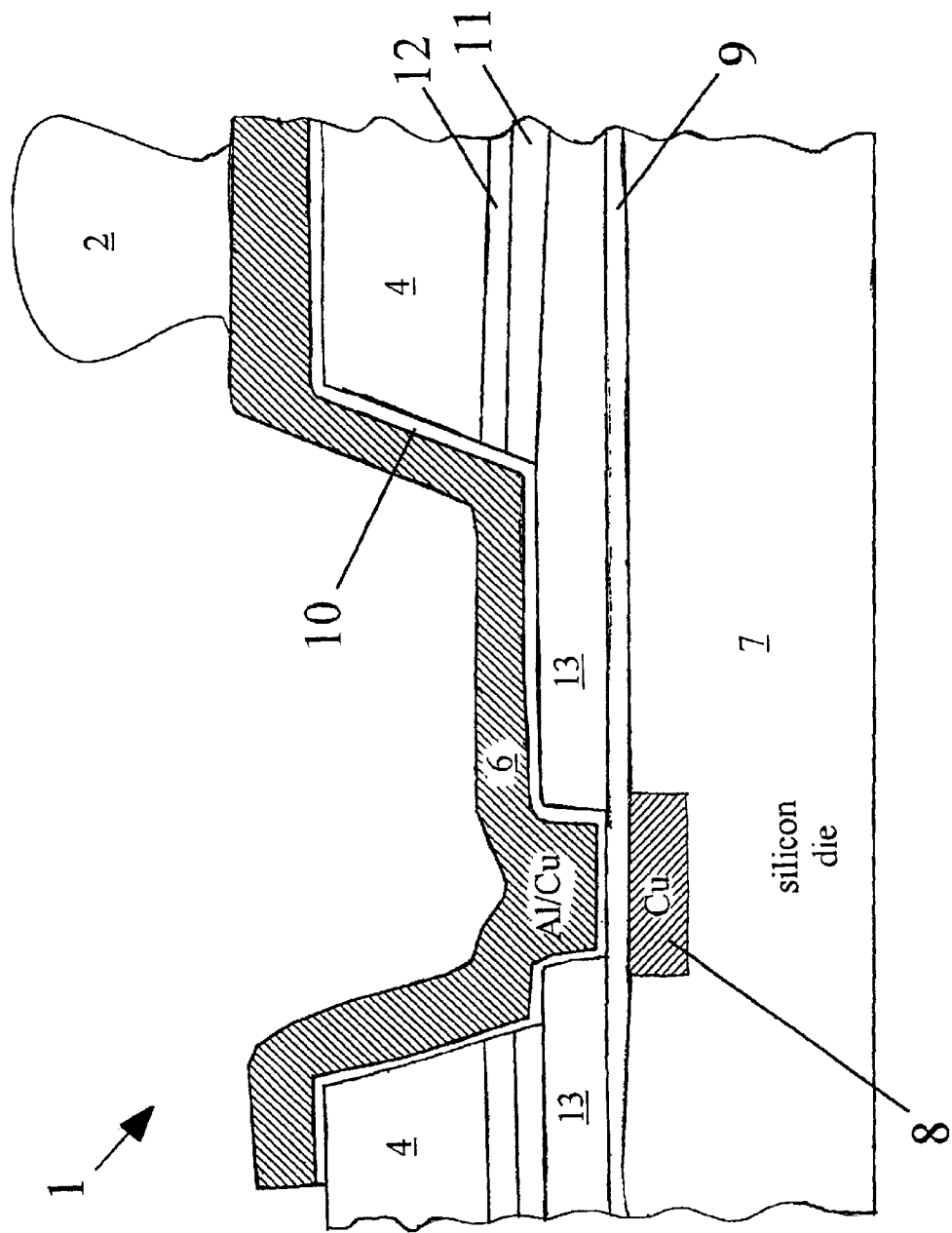
FIG. 2 shows an embodiment of the invention in cross-section.

The method of the invention is to eliminate the back-end rerouting procedure by modifying the front-end metal deposition. The procedure is as follows:

Referring to FIG. 2, the last Cu layer 8 is covered with a silicon nitride 9 and a silicon oxide 13 layer like in the prior art. A contact hole (via) is defined by lithography and etched into oxide and nitride to provide electrical contact to the last metal level 6 which is an aluminum copper alloy (AlCu). Afterwards a passivation consisting of an oxide layer 11 and nitride layer 12 is deposited. Other known passivation layers may alternatively be used, such as borosilicate glass (BSG). On top of the passivation a photosensitive poly-imide 4 is deposited, exposed and developed. A large terminal via is etched into the nitride 12 and oxide 11 stopping on top of the oxide layer 13. It has to be considered, that all of the material deposited into the vias will be removed to allow the AlCu alloy to contact the Cu (dual-) damascene layer.

After defining the large contact holes (terminal vias) a conductive layer of preferably aluminum-copper alloy is deposited. It will be patterned so that it is part of the circuitry of the device and additionally provides pads where the solder balls can be placed in the right position for BGA packaging. Hence, the pads are now in direct electrical contact with the circuitry through a single, substantially homogenous, conductive layer. It is preferable to first provide a barrier layer 10 before depositing the conductive layer.

Traditionally, the solder balls are disposed upon a gold/copper alloy. Because the solder balls in this invention are placed directly upon a AlCu metallization, one may consider adjusting the solder material to maximally bind to the metal alloy. Generally, so long as the material contains copper, there should be little difficulty in bonding to a typical lead/tin alloy solder, so the aluminum/copper alloy should bond as satisfactorily as the gold/copper alloy of the prior art.

As can be seen, the back-end rerouting procedures are completely eliminated by the invention, thereby saving processing costs and time. Further, reliability is improved because the solder balls are now in immediate contact with the circuitry of the chip, rather than contacting through a conductive intermediary.

It is to be understood that all physical quantities disclosed herein, unless explicitly indicated otherwise, are not to be construed as exactly equal to the quantity disclosed, but rather as about equal to the quantity disclosed. Further, the mere absence of a qualifier such as "about" or the like, is not to be construed as an explicit indication that any such disclosed physical quantity is an exact quantity, irrespective of whether such qualifiers are used with respect to any other physical quantities disclosed herein.

While preferred embodiments have been shown and described, various modifications and substitutions may be made thereto without departing from the spirit and scope of the invention. Accordingly, it is to be understood that the present invention has been described by way of illustration only, and such illustrations and embodiments as have been disclosed herein are not to be construed as limiting to the claims.

What is claimed is:

1. A method of chip scale packaging, comprising the steps of:
   providing a semiconductor die having internal metal lines formed therein, wherein said internal metal lines comprise metallic damascene layers, and wherein a final metal layer of the internal metal lines comprises at least one exposed region on a surface of the semiconductor die;
   depositing an insulative layer over the surface of the semiconductor die;
   etching through said insulative layer so as to provide an opening to said exposed region of said final metal layer of said internal metal lines;
   depositing a passivation layer over said insulative layer;
   depositing a compliant material layer over said passivation layer;
   etching through said compliant material and said passivation layer so as to provide an opening to said exposed region of said final metal layer of said internal metal lines;
   depositing a substantially homogenous conductive layer;
   patterning said substantially homogenous conductive layer to form a conductor comprising a pad disposed on said compliant layer, wherein the conductor electrically contacts said exposed region of said final metal layer of said internal metal lines so as to provide a direct electrical connection between the pad and said final metal layer; and
   forming a solder bail upon said pad.

2. The method of claim 1 wherein said passivation layer comprises a silicon nitride layer atop a silicon oxide layer.

3. The method of claim 1 wherein said passivation layer comprises borosilicate glass.

4. The method of claim 1, wherein said internal metal lines comprise copper.

5. The method of claim 1 wherein said insulative layer comprises a silicon oxide layer atop a silicon nitride layer.

6. The method of claim 1 wherein said step of etching through said compliant material is executed in a manner effective in not etching said insulative layer and in forming vias of greater width than said openings through said insulative layer.

7. The method of claim 1 wherein said conductive layer comprises aluminum an copper.

8. The method of claim 1 further comprising the step of depositing a barrier layer prior to said deposition of said conductive layer.

9. The method of claim 8 wherein said barrier layer comprises at least one of tantalum nitride, titanium nitride, or tungsten nitride.

10. The method of claim 1 wherein said compliant material comprises a polyimide.

11. A method of chip scale packaging, comprising the steps of:
   providing a semiconductor die having internal metal lines formed therein, wherein said internal metal lines comprise metallic damascene layers, and wherein a final metal layer of the internal metal lines comprises at least one exposed region on a surface of the semiconductor die;
   depositing an insulative layer;
   depositing a compliant material layer;
   etching said compliant material and said insulative layer to form an opening to said exposed region of said final metal layer of said internal metal lines;
   forming a conductor comprising a pad disposed on said compliant layer, wherein the conductor electrically contacts said exposed region of said final metal layer so as to provide a direct electrical connection between said pad and said final metal layer; and
   forming a solder ball upon said pad.

* * * * *